United States Patent
Patapoutian et al.

(10) Patent No.: US 8,711,619 B2
(45) Date of Patent: Apr. 29, 2014

(54) CATEGORIZING BIT ERRORS OF SOLID-STATE, NON-VOLATILE MEMORY

(75) Inventors: Ara Patapoutian, Hopkinton, MA (US); Arvind Sridharan, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 280 days.

(21) Appl. No.: 13/275,418

(22) Filed: Oct. 18, 2011

(65) Prior Publication Data
US 2013/0094288 A1    Apr. 18, 2013

(51) Int. Cl.
G11C 16/04    (2006.01)
G11C 16/06    (2006.01)

(52) U.S. Cl.
USPC .................. 365/185.03; 365/85.2; 365/185.18

(58) Field of Classification Search
USPC .............................. 365/185.03, 185.2, 185.18
See application file for complete search history.

(56) References Cited

U.S. PATENT DOCUMENTS

| | | | |
|---|---|---|---|
| 6,044,019 A | 3/2000 | Cernea et al. | |
| 6,522,580 B2 | 2/2003 | Chen et al. | |
| 7,023,735 B2 | 4/2006 | Ban et al. | |
| 7,372,731 B2 | 5/2008 | Ban | |
| 7,535,765 B2 | 5/2009 | Maayan | |
| 7,558,109 B2 | 7/2009 | Brandman et al. | |
| 7,593,259 B2 | 9/2009 | Kim | |
| 7,663,914 B2 * | 2/2010 | Lee ........................ 365/185.03 | |
| 7,890,818 B2 | 2/2011 | Kong et al. | |
| 7,903,468 B2 | 3/2011 | Litsyn et al. | |
| 7,944,757 B2 | 5/2011 | Moschiano et al. | |
| 7,945,825 B2 | 5/2011 | Cohen et al. | |
| 7,974,132 B2 | 7/2011 | Cornwell et al. | |
| 7,990,764 B2 | 8/2011 | Alrod et al. | |
| 8,000,135 B1 | 8/2011 | Perlmutter et al. | |
| 8,000,141 B1 | 8/2011 | Shalvi et al. | |
| 8,068,361 B2 | 11/2011 | Kang et al. | |
| 8,077,520 B1 | 12/2011 | Yang et al. | |
| 8,289,781 B2 | 10/2012 | Litsyn et al. | |
| 8,331,169 B1 | 12/2012 | Yang et al. | |
| 8,345,477 B1 * | 1/2013 | Yang ........................ 365/185.03 |
| 8,351,258 B1 | 1/2013 | Yang et al. | |
| 8,363,501 B1 | 1/2013 | Ramamoorthy et al. | |
| 8,369,141 B2 | 2/2013 | Sommer et al. | |
| 8,386,890 B2 | 2/2013 | Wezelenburg et al. | |
| 8,498,152 B2 | 7/2013 | Alrod et al. | |
| 8,531,888 B2 | 9/2013 | Chilappagari et al. | |
| 2006/0028875 A1 | 2/2006 | Avraham et al. | |

(Continued)

FOREIGN PATENT DOCUMENTS

| | | |
|---|---|---|
| WO | WO2008078314 | 7/2008 |
| WO | WO2011008367 | 1/2011 |
| WO | WO2011094454 | 8/2011 |

OTHER PUBLICATIONS

U.S. Appl. No. 13/275,598, filed Oct. 18, 2011, Sridharan et al.

(Continued)

*Primary Examiner* — Hoai V Ho
*Assistant Examiner* — Tri Hoang
(74) *Attorney, Agent, or Firm* — Hollingsworth Davis, LLC

(57) ABSTRACT

Bit errors affecting cells of a solid-state, non-volatile memory are assigned to at least a first or a second category based on a relative amount of voltage shift that caused the respective bit errors in the respective cells. A reference voltage used to access the respective cells is adjusted to manage the respective bit errors of the first category. Additional corrective measures are taken to manage the respective bit errors of the second category.

19 Claims, 8 Drawing Sheets

(56) References Cited

U.S. PATENT DOCUMENTS

| | | |
|---|---|---|
| 2009/0287975 A1* | 11/2009 | Kim et al. ............... 714/746 |
| 2010/0118608 A1 | 5/2010 | Song et al. |
| 2010/0199149 A1 | 8/2010 | Weingarten et al. |
| 2011/0038212 A1 | 2/2011 | Uchikawa et al. |
| 2011/0066902 A1 | 3/2011 | Sharon et al. |
| 2011/0069521 A1 | 3/2011 | Elfadel et al. |
| 2011/0141827 A1 | 6/2011 | Mozak et al. |
| 2011/0182118 A1 | 7/2011 | Litsyn et al. |
| 2011/0216598 A1 | 9/2011 | Kim et al. |

OTHER PUBLICATIONS

Mielke et al., "Bit Error Rate in NAND Flash Memories", 46$^{th}$ Annual International Reliability Physics Symposium, Phoenix, 2008, pp. 9-19.

U.S. Appl. No. 13/275,497, filed Oct. 18, 2011, Sridharan et al.

Dec. 2010, Yaakobi et al., "Error Characterization and Coding Schemes for Flash Memories", GLOBECOM Workshops, 2010, IEEE, 5 pages.

U.S. Appl. No. 13/475,497, filed Oct. 18, 2011, Sridharan et al.

U.S. Appl. No. 13/475,598, filed Oct. 18, 2011, Sridharan et al.

U.S. Appl. No. 13/275,675, filed Oct. 18, 2011, Sridharan et al.

File History for U.S. Appl. No. 13/275,598 retrieved from the U.S. Patent and Trademark Office on Oct. 2, 2013, 96 pages.

File History for U.S. Appl. No. 13/275,675 retrieved from the U.S. Patent and Trademark Office on Oct. 2, 2013, 125 pages.

File History for U.S. Appl. No. 13/275,497 retrieved from the U.S. Patent and Trademark Office on Nov. 1, 2013, 254 pages.

* cited by examiner

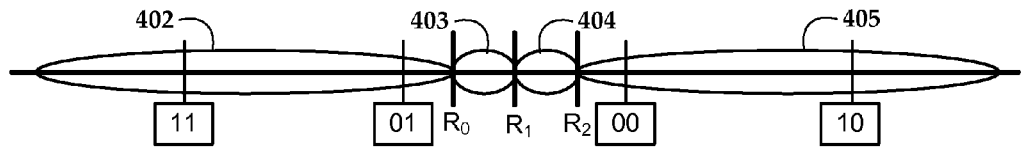
*FIG. 4A*
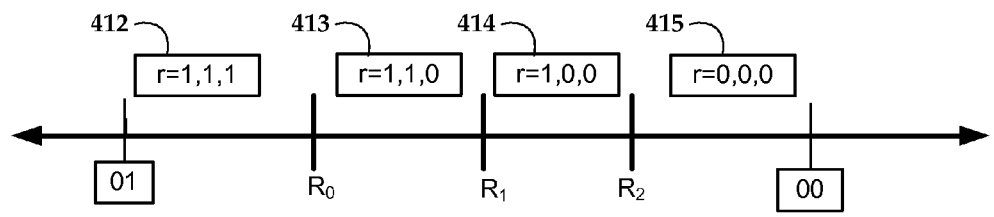
*FIG. 4B*
SOFT READ RESULT
| 420 | | [1,1,1] | [1,1,0] | [1,0,0] | [0,0,0] |
|---|---|---|---|---|---|
| EXPECTED LSB (OR MSB) VALUE | 0 | p(0, [1,1,1]) | p(0, [1,1,0]) | p(0, [1,0,0]) | p(0, [0,0,0]) |
| | 1 | p(1, [1,1,1]) | p(1, [1,1,0]) | p(1, [1,0,0]) | p(1, [0,0,0]) |
*FIG. 4C*

CATEGORIZING BIT ERRORS OF SOLID-STATE, NON-VOLATILE MEMORY

SUMMARY

The present disclosure is related to systems and methods for managing errors in non-volatile, solid-state memory. For example, in one embodiment, a method, apparatus, and/or computer readable medium facilitates assigning bit errors affecting cells of a solid-state, non-volatile memory to at least a first or a second category based on a relative amount of voltage shift that caused the respective bit errors in the respective cells. Voltage boundaries used to access the respective cells are adjusted to manage the respective bit errors of the first category. Additional corrective measures are taken to manage the respective bit errors of the second category.

In another embodiment, a voltage difference is determined between an expected voltage level and an actual voltage level associated with a bit error affecting at least one cell of a solid-state, non-volatile memory. In response to the voltage difference satisfying a threshold, a parameter used to access the cell is adjusted based on the voltage difference. Additional corrective measures are taken to manage the bit error in response to the voltage difference not satisfying the threshold.

These and other features and aspects of various embodiments may be understood in view of the following detailed discussion and accompanying drawings

BRIEF DESCRIPTION OF THE DRAWINGS

In the following diagrams, the same reference numbers may be used to identify similar/same components in multiple figures.

FIGS. 4A and 4B are block diagrams illustrating categories of soft read results and errors according to an example embodiment;

FIG. 4C is a chart illustrating categories of soft read results according to an example embodiment

DETAILED DESCRIPTION

Figure 1A:
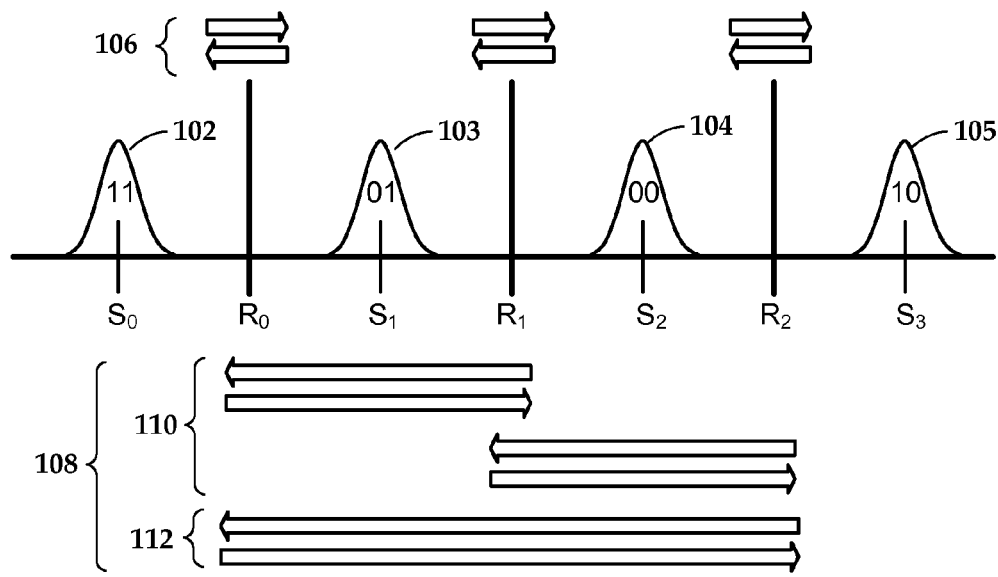
FIG. 1A is a graph illustrating categories of memory errors according to example embodiments.

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the claims appended hereto.

The present disclosure is generally related to solid-state, non-volatile memory. In many implementations, solid-state, non-volatile memory uses cells similar to a metal-oxide semiconductor (MOS) field-effect transistor (FET), e.g., having a gate (control gate), a drain, and a source. The cells also include what is known as a "floating gate" that can retain a charge in the absence of external power. When a selected voltage is applied to the control gate, differing values of current may flow through the channel depending on the amount of charge on the floating gate. This current flow can be used to characterize two or more states of the cell that represent data stored in the cell.

Non-volatile memory cells of this type are know to exhibit errors caused, for example, by charge leakage, manufacturing defects, disturb effects, etc. These errors may be manifested as bit errors in the decoded data. A memory device may use a number of measures to account for these errors, such as error correction codes (ECC), which utilize extra data for detecting and correcting bit errors. The memory device may generate a bit error rate (BER) signal based on ECC activity, and can use BER to analyze system performance. However, BER may not fully take into account the causes of certain types of errors.

In the present disclosure, apparatuses, systems and methods are described that can categorize the underlying causes of certain types of data errors, e.g., considering the underlying structure and/or electrical conditions that may differentiate different types of errors from one another. Based on this categorization, appropriate measures can be taken based on the category of a particular error. This type of categorization may be able provide more information to the controller over what can be determined based on BER alone. As a result, a controller can more effectively manage errors using the categorization data.

The discussion below makes reference to flash memory, which may include NOR flash, NAND flash, 2D NAND flash, 3D NAND flash (also called vertical NAND, or VNAND) and various other technology types. These types of flash memory may be divided into two different classifications: single-level and multi-level cell memory. Single level cell (SLC) flash memory uses floating gate memory cells that store one bit of data per cell by distinguishing between two floating gate voltage levels. In contrast, multi-level cell (MLC) flash memory can be programmed to store two or more bits of information using more than two floating gate voltage levels. Because it can store more data per cell, MLC flash memory is less expensive than SLC on a per-byte basis. However, MLC flash memory has lower margin for error due to the increased resolution needed to differentiate between voltage levels. As a result, MLC may be more error-sensitive than SLC flash memory in response to such factors as repeated use (e.g., wear) and leakage of charge over time (e.g., data retention errors).

In general, a memory cell may be programmed to a number of voltages, M, where M can represent any of $2^m$ memory states. The value m is equal to the number of bits stored, and is greater than 1 for MLC memory. For example, memory cells programmable to four voltages can store two bits per cell (M=4, m=2); memory cells programmable to eight voltages have a storage capacity of three bits per cell (M=8, m=3), etc. While specific examples below are illustrated as two-bit-per-cell, MLC NAND flash memory, it is not intended that the concepts and embodiments described herein be solely limited to this type of memory. For example, while MLC may be often used in the industry to refer to only two-bit per cell memory, in the present disclosure, MLC may refer to any number of multiple bits per cell. The categorization of errors and other features described below may be applicable to other types of non-volatile, solid state memory, e.g., those devices that share analogous features of the MLC NAND flash devices described herein.

An example of how data is stored a two-bit per cell MLC device is shown in the graph of FIG. 1A. The digital states/symbols 11, 01, 00, 10 are associated with voltages distributions 102-105 respectively. The voltages $S_0$-$S_3$ are respective center/average voltage levels for each of the distributions 102-105. Voltages $R_0$-$R_2$ are reference voltages that serve as boundaries between each of the states/symbols. For example, after programming a value of 01 in a cell, the cell should exhibit a read threshold voltage that falls somewhere in distribution 103 if the cell is properly functioning. However, if the actual voltage read for this cell is instead less than $R_0$ or greater than $R_1$, then a bit error may occur when the cell is read. In the discussion that follows, the voltages $R_0$-$R_2$ may be referred to alternatively as reference voltages and/or boundary voltages. The voltages $S_0$-$S_3$ may also be described as reference voltages, although of a different type than $R_0$-$R_2$.

Figure 1B:
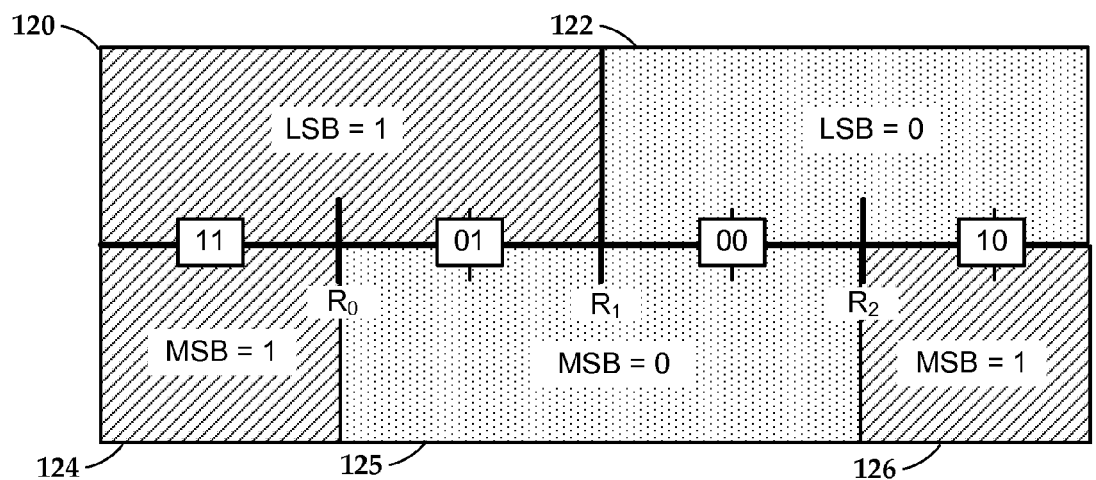
FIG. 1B is a graph illustrating voltage regions for reading least and most significant bits according to example embodiments.

It should be noted that in an arrangement such as shown in FIG. 1A, the two bits in each cell need not be associated with the same word or page. For example, a memory system may be arranged so that the leftmost bit (most significant bit, or MSB) is associated with one word/page, and the rightmost bit (least significant bit, or LSB) is associated with another word/page. This arrangement may be referred to herein as "multipage," and can be seen by way of example in the graph of FIG. 1B. In this arrangement, if a page utilizes the LSB of the symbol, then the data associated with the cell can be determined based only whether the read voltage is to the left or the right of $R_1$, as indicated by regions 120 and 122. Similarly, if the MSB of the symbol is utilized, the value can be determined based on whether or not the read voltage is between $R_0$ and $R_2$, as indicated by regions 124-126.

Generally, a variety of ECC algorithms are known that can correct a known number of bit errors for a predefined word size and number of ECC bits. Flash systems may use multiple levels of error coding (e.g., inner and outer coding) to improve overall error correction performance. The ECC is associated with a bit error rate (BER) metric that is used to gauge flash and error correction performance in general. However, BER may not take into account the underlying causes of the errors, such as whether the error represents a common or unusual physical deviation for the type of media involved. As seen in FIG. 1A, the term "physical deviations" may at least refer to how far and/or in what direction an actual voltage is located compared to what it is expected to be if there were no error.

Generally, a bit error occurs when the threshold voltage representing the data deviates from its expected range of values. Thus, in reference again to FIG. 1A, if the threshold voltage originally programmed to be in the range 102 was later read-back as being in the adjacent range 103, then a one-bit error ("01" instead of "11") would occur. A one-bit error would also occur if the threshold voltage was instead in the range 105 ("10" instead of "11"). However, the latter case may represent a more serious physical problem with the underlying cell than the former, because the deviation in the latter case is significantly larger than the former. The existence and extent of these types of deviations may not be apparent when looking at BER alone.

In FIG. 1A, arrows generally indicated by reference numeral 106 and 108, represent different categories of errors that may be manifested by a memory device according to example embodiments. These arrows 106, 108 may be referred to herein alternately as voltage shifts and/or errors. The arrows 106, 108 represent a change in floating gate voltage thresholds from an expected level to an actual, measured level. For purposes of this discussion, the term "expected levels" at least refers to a range of voltage thresholds should be exhibited by the cell during a read operation, typically without applying any ECC to correct bit errors. The expected levels may differ somewhat from nominal and/or ideal levels, based on such factors as cell age, elapsed time since the data was written, environmental conditions, etc. The operation during which the "actual" voltage value is determined may occur during any type of data access operation, including reads, writes, erasures, etc. If the actual measurement is different than the expected to the extent that a bit error would occur, the arrows 106, 108 indicated a direction and magnitude of that difference.

For the four-level MLC shown in FIG. 1A, there are twelve total errors in two groupings 106, 108. The number of these types of errors may be generally represented as M*(M−1), where M is the number of different voltage levels used to store data in each cell. The first group of errors 106 represent a shift that causes the actual voltages to be located in a voltage range 102-105 that is adjacent to the expected range. There are six (2M−2) of these types of errors 106 for two-bit per cell MLC memory. For example, reading a "11" when a "01" was programmed indicates the actual voltage shifted to the left across the $R_0$ boundary.

The second group of errors 108 represents shifts that cause the actual measurements to be located in voltage ranges 102-105 that are not adjacent to the expected voltage ranges 102-105. There are six ($M^2$−3M+2) of these types of errors 108 for two-bit per cell MLC memory. This group 108 is broken into two subgroups, 110 and 112. Subgroup 110 represents shifts of more than one voltage range, and subgroup 112 represents shifts of more than two voltage ranges.

For purposes of discussion, the first group of errors 106 may be referred to as "common" or "simple" errors. This terminology (as well as the terminology "first" and "second") is not intended to require that the underlying causes of the errors are limited to any particular complexity or difficulty to diagnose or correct. The term "simple error" may generally indicate that error 106 is at least more common than errors 108 in a typical memory device. In many instances, simple errors 106 may be caused by well-known phenomena such as loss of charge loss over time and/or in response to high temperature. Other phenomena that can often lead to simple errors is known as "disturb," which is changes in stored charge of a floating gate caused by activity (e.g., reading, programming) occurring in physically adjacent cells.

In contrast to simple errors 106, complex errors 108 may be less likely to occur in a nominally functioning memory device. While complex errors 108 can be caused by the same phenomena (e.g., passage of time, disturb) that causes simple errors 106, the magnitude of the threshold shift is larger than would normally be expected, even if the device is subjected to extremes within its specified operating conditions. This could be the result of other factors, such as manufacturing defects, localized perturbations (e.g., electrical shock, thermal hotspots), design defects, accelerated wear, etc. For example, some cells may exhibit a failure mode where the state of the cell is not affected by the level to which it is programmed. Generally, it may be desirable for a device to treat errors of the complex type 108 differently than those of the simple type 106.

Figure 2:
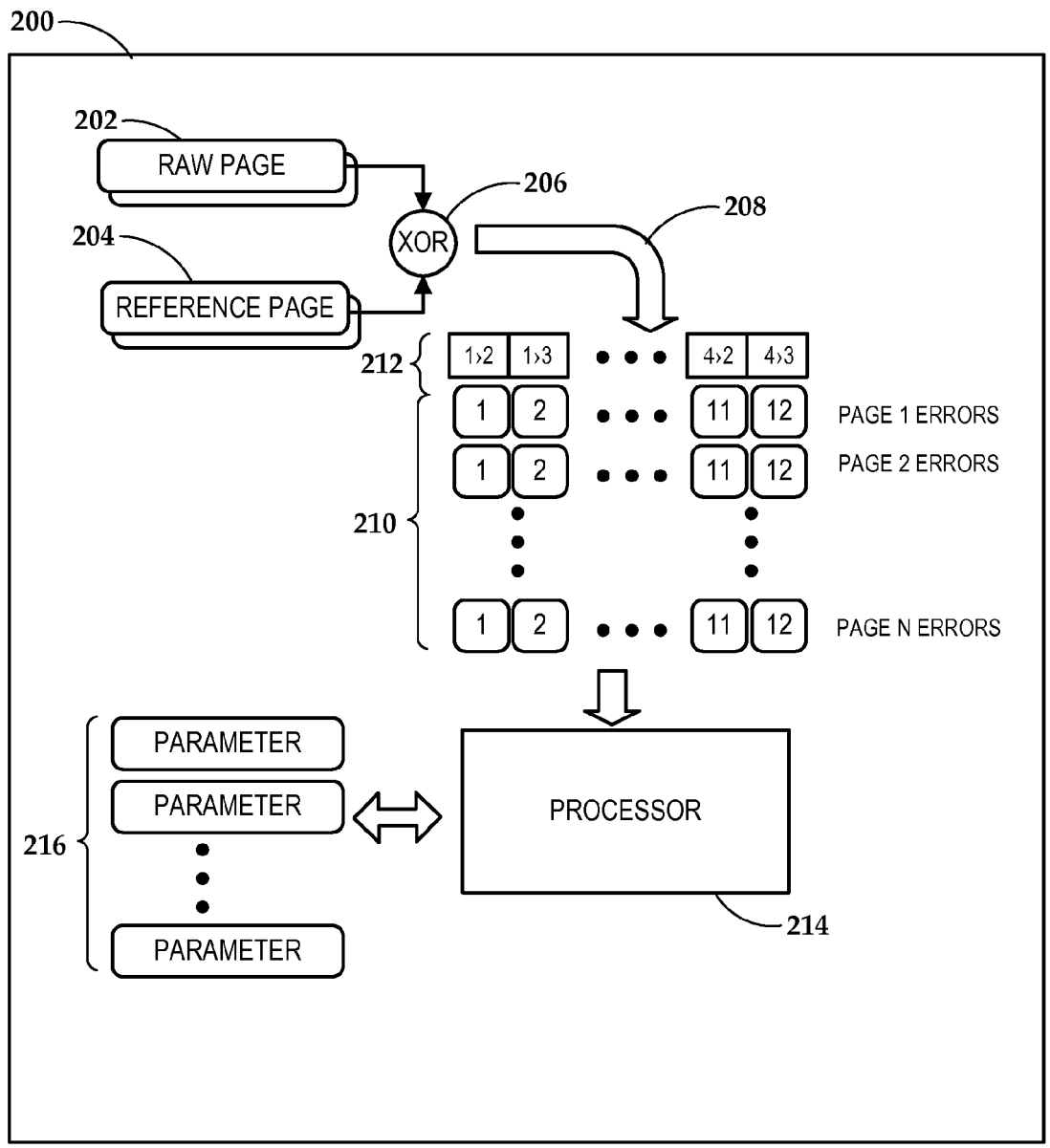
FIG. 2 is a block diagram of a system according to an example embodiment.

In reference now to FIG. 2, a block diagram illustrates a system 200 for categorizing errors according to example embodiments. Generally, the system 200 may be implemented within a self-contained memory device, and/or may include functional components outside the device (e.g., a host). The system 200 compares raw page data 202 to reference page data 204 via a bitwise XOR operator 206.

The reference page data 204 is intended to represent a "correct" version of what is actually stored in the raw page data 202. As a result, the system 200 may take additional measures to ensure the reference page data 204 can be read back correctly and reliably. For example, the reference page data 204 may include user data stored with extra ECC to ensure successful decoding even in there are large numbers of read errors. In other arrangements, extra copies of the data 204 may be stored in areas known to have high reliability, the data 204 may determined/reconstructed from external resources (e.g., a host), etc. Or, the reference data 204 may include a known or predetermined pattern that does not require decoding from programmable memory, e.g., may be coded into firmware or hardware.

The raw page data 202 may include page data that is decoded using current system parameters, e.g., adjusted read reference voltages to account for age and other factors but without using correction algorithms such as ECC. An XOR 206 of the raw page data 202 with associated reference data 204 will result in a value of one for any bits that don't agree between the two pages 202, 204, and zero for all other bits. The output 208 of the XOR operator 206 then analyzed to increment "buckets" 210. Each bucket 210 holds a sum related to an error category, as indicated by column headings 212. There are twelve headings 211 for each column, each corresponding to the twelve types of errors 106, 108 shown in FIG. 1A.

A processor 214 analyzes the error buckets 210 and uses the data to adjust parameters 216. These parameters 216 may be page-specific, and/or be related to smaller or larger divisions of memory. As will be described in greater detail below, the parameters 216 may be used to adjust reference voltages used in programming/reading the pages, and may be used for additional corrective measures. This adjustment may use various arrangements of the error buckets 210, such as two buckets formed based on whether the errors are simple 106 or complex 108. For simple or complex errors 106, 108 reference voltages used in defining the data (e.g., $S_0$-$S_3$ and $R_0$-$R_2$ shown in FIG. 1A) may be adjusted based on magnitudes and directions associated with particular ones of the errors. Other corrective measures, such as retiring a page and/or adjusting ECC used in decoding and encoding the page, may also be used, such as where the errors are complex 108.

In general, to determine all twelve values 212 for each of the buckets 210, both MSB and LSB pages (see FIG. 1B) may need to be read to determine data 202 and 204. However, in some cases shortcuts can be taken. For example, if it is desired only to optimize LSB page read boundaries (e.g., boundary $R_1$ in FIGS. 1A and 1B) then obtaining a subset of the twelve bucket categories 212 may be sufficient, and MSB pages need not be read. In some arrangements, the bucket computation can be carried out over units larger or smaller than a page.

The actions performed by system 200 related to calculation of the buckets 210 may occur at any time in the life of the associated memory apparatus. At least some of the actions may be triggered by data access operations, such as reads, programs, erasures, garbage collection, error recovery mode, etc. The actions may also be performed based on time intervals and or usage statistics. Flash characteristics may degrade with program/erase (PE) cycles and retention time (e.g., time since data was last programmed/refreshed). As a result, it may be useful to perform the actions at different times over the life of the system 200.

Flash errors as shown in FIG. 2 may be categorized at different time intervals for at least two reasons. One reason is to re-optimize the flash, such as re-optimizing reference voltages used in both read and write operations. This will tend to increase reliability and performance, e.g., less overhead associated with verification and error correction. Another reason to evaluate the errors as shown in FIG. 2 is to effectively manage the life of the device. This may involve modifying ECC characteristics (e.g., codes used, number of ECC bits used) and when to retire different units of memory. For example, the system may artificially increase the estimated life (which is often measured in terms of number of PE cycles) of particular pages/blocks due to the repeated occurrence of particular types of errors. This increase in estimated life may indicate to the system that the affected pages may be less reliable, and therefore should be used less and/or retired from use earlier.

One example set of metrics that may be used to categorize MLC flash errors are conditional error probabilities. For example, the conditional error probabilities $p(i,j)$, $j \neq i$, is defined as the probability of programmed level $s_i$ being detected as $s_j$. As shown in FIG. 1A, for two-bit per cell MLC, there are $M^*(M-1)=12$ such conditional probabilities. If in a page there are $n_{ij}$ cells, that were programmed to $s_i$ level and read back as $s_j$, then $p(i,j)$ can be estimated to be $p(i,j)=n_{ij}/N$, where N is the number of cells in a page. It is sometimes convenient to maintain the average value of $n_{ij}$ rather than $p(i,j)$. In this disclosure, $p(i,j)$ may be used to refer to both the raw counts and the conditional probability estimates, distinguishing between the two if needed.

Some techniques for generating optimized reference voltage values may use conditional probabilities as input. Other reference voltage generating methods may instead use the standard deviation or the variance of the noise associated with each signal $s_i$. Under the assumption of a given disturbance distribution, the conditional probabilities can be converted to standard deviations. For example, for the Gaussian distribution, the probability and the standard deviation are related by the Q-function. In such a case, one way of obtaining the standard deviation from conditional probability buckets is by using a Q-function look-up-table.

In the example system 200, decoded digital data 202 and/or 204 is used as an indirect indicator of threshold voltages and/or voltage ranges, which in turn are used to populate data in the error buckets 210 in order to categorize the types of errors. However, the system 200 may be adapted to determine the voltage data in other ways, and use alternate bucket categories with this data. For example, a flash memory may have provisions for reading read threshold voltages directly. In such a case, a probability $p(i,j)$ may be expressed as the probability of a cell programmed to v, threshold level being read back in the range $v_{1j}$-$v_{2j}$. These ranges may correspond to $S_0$-$S_3$ and/or $R_0$-$R_2$ shown in FIG. 1A, or may be of coarser or finer granularity. In such a case, the probabilities may still be used to form categories such as simple and complex, and those categories may use different voltage delimiters to define those categories compared to an implementation that indirectly determines threshold voltages based on digital data stored in the cells.

Figure 3:
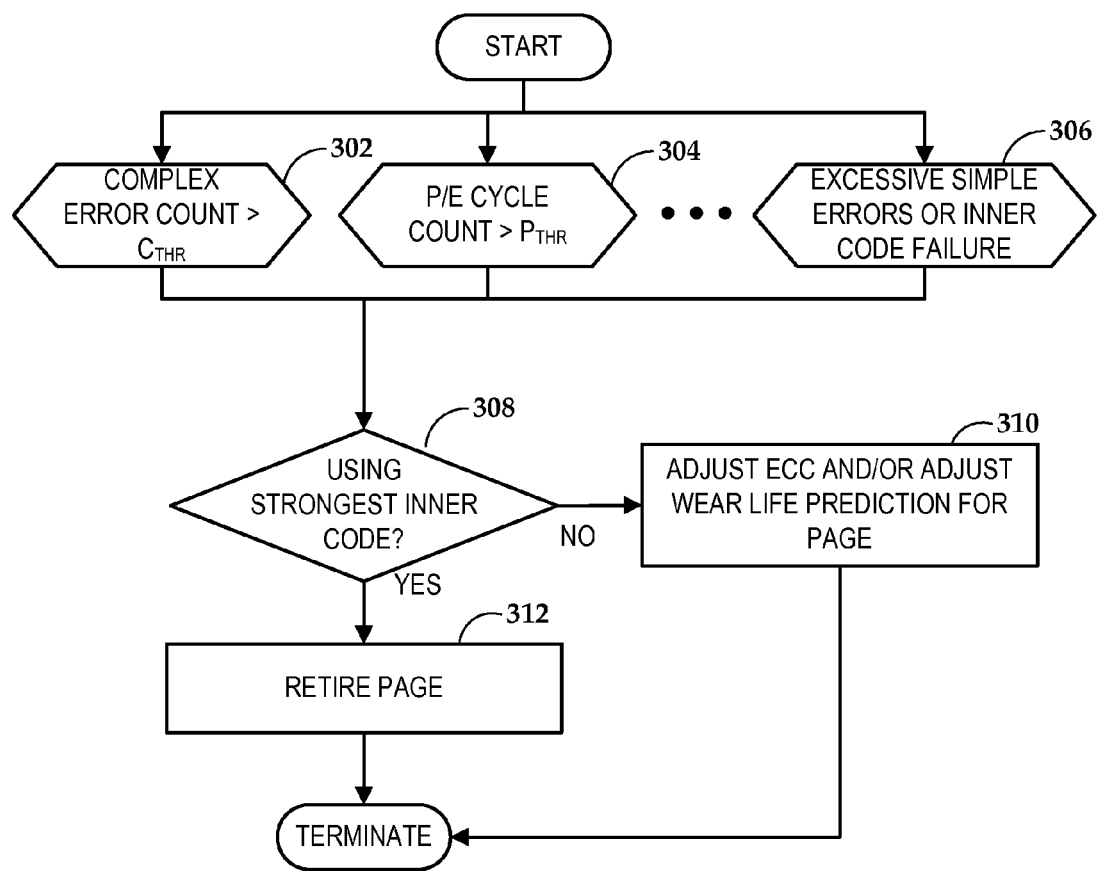
FIG. 3 is a flowchart of a procedure for acting on detected errors according to an example embodiment.

In reference now to FIG. 3, a flowchart illustrates a procedure for managing memory life using error measurements according to an example embodiment. In this example, all simple buckets are added underneath one metric, and all the complex buckets are added under another metric. As can be seen at block 302, the complex error metric is used in parallel with other metrics (e.g., PE cycle count at 304 and other failures 306) in order to adjust 310 ECC and or life prediction. If it is determined 308 that the strongest inner code is already being used, then the page may be retired 312. This procedure generally takes advantage of complex errors being isolated as described herein. The controller can use this information to decide when to retire cells/pages, change ECC characteristics, etc. The determination and categorization of complex errors can provide more information to the controller over what can be determined based on BER alone.

The concepts described herein can be further applied to reading of soft data used to determine the memory values. Soft data generally refers to a technique of reading data that provides both an estimate of the stored binary value along with a reliability indicator. For example, multiple reads may be used in order to obtain higher resolution in soft information. In such a case, multiple read reference voltages may need to be optimized. The choice of read reference voltage(s) may vary depending on whether the MSB or LSB bit is to be recovered. In FIG. 4A, a diagram illustrates the soft LSB page with three reads, and four regions 402-405. In general, if k reads (e.g., k read thresholds) are used then (k+1) regions are created. Bucket classification may be used with soft data, where the j in p(i,j) refers to a region 402-405 in FIG. 4A rather than a single detected cell voltage. For each soft data cell, three read thresholds are used to determine the appropriate region 402-405.

As an example, consider a cell programmed with an LSB of 0 where three reads are carried out as shown in FIG. 4A. Depending on the noise magnitude, the read value falls in one of the four regions 402-405. This determines which of the four buckets, corresponding to the LSB being 0, the read value belongs to. This is also illustrated in FIG. 4B, which show results 412-415 of three read values of the LSB. Each of the results 412-415 corresponds to respective ones of the four regions 402-405 shown in FIG. 4A. These results 412-415 may each correspond to one of the four buckets corresponding to the LSB being 0 or 1. This can be seen in FIG. 4C, in which a table 420 shows specific values of eight p(i,j) buckets for the LSB soft read examples of FIGS. 4A and 4B. In general, with k reads, two sets of (k+1) buckets are obtained; one corresponding to the bit being 0 and the other to the bit being 1.

Figure 5:
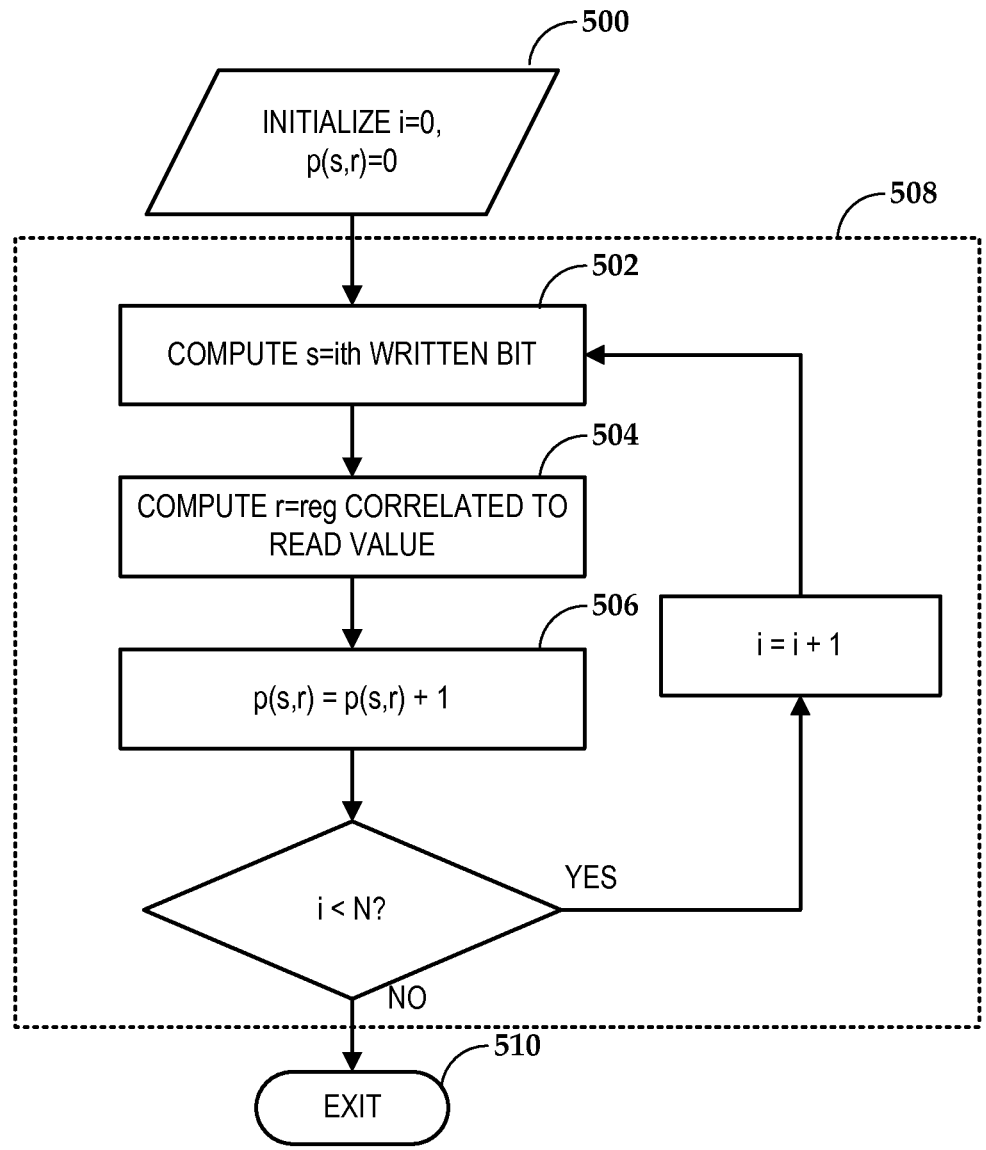
FIGS. 5 and 6 are a flowcharts of error computation procedures according to an example embodiments.

In reference now to FIG. 5, a flowchart illustrates a general process of determining the buckets according to an example embodiment. Certain variables are initialized 500, including the variable "i," which is a counter for iterating through each bit of the page being analyzed. It will be appreciated that the procedure need not be limited to bitwise iteration through a page. The procedure may be generally extended to any appropriate data segments appropriate to a particular arrangement of memory, and iteration may occur using any subsegment thereof (e.g., bits, bytes, words, etc.).

Figure 6:
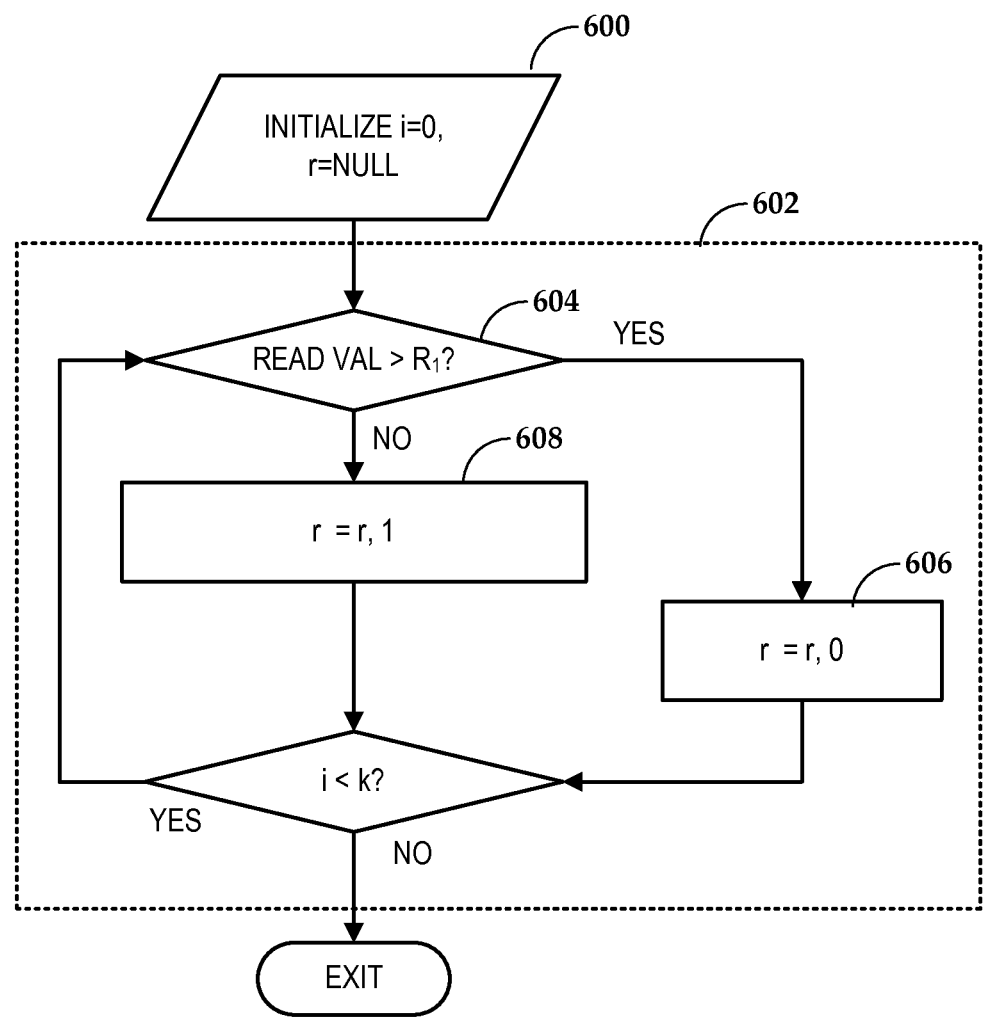

Also at block 500, a conditional probability p(s,r) is initialized to zero. The three blocks 502, 504, 506 are performed in a loop 508 for each value of i. At block 502, the written or ideal bit value $s_i$ is determined. It is possible to have a dedicated region per page or page where known data $s_i$ is written and can be subsequently read. Alternatively, known data $s_i$ can be recorded/predetermined for this task. The successfully decoded (or predetermined) values of $s_i$ can be used to determine if the written bit was a 0 or 1. At block 504, the region to which the read value belongs is determined, and the actual value $r_i$ is determined A more detailed example of block 504 for soft decisions is shown in the flowchart of FIG. 6, which is discussed below. At block 506, the buckets p(s,r) containing the raw counts (non-negative integers) are updated with the results of blocks 502, and 504.

At the end of the loop 508, the routine exits 510 with a probability distribution for the page being analyzed. These could be normalized based on N, e.g., p(s,r)=p(s,r)/N. Assuming there were no errors (e.g., errors that might occur if a hard decision algorithm were used) for a page with equal numbers of ones and zeros, the normalized probabilities may be as follows: p(0, [0,0,0])=0.5, p(1, [1,1,1])=0.5, with all others being zero. More minor/simple errors might show up as non-zero values of, for example, p(0, [0,0,1]), which might not lead to a bit error being reported (e.g., soft algorithm would still choose "0" as the actual stored value), but would produce lower reliability metrics associated with the bit value. Such probabilities may considered simple errors as described above and be used in the same way, e.g., adjusting read reference voltages. In contrast, non-zero probabilities of p(0, [1,1,1]) or p(0, [1,1,0]), for example, may not only produce bit errors in the actual data read, but might point to a more serious physical problem in the media. Counts and/or probabilities of these types of errors may be categorized as complex errors and may be used to apply additional corrective measures such as increased ECC and/or retiring of cells/pages.

In FIG. 6, a flowchart shows a procedure for determining a label for the region to which a read value belongs as shown in block 504 of FIG. 5. This example is for an LSB page as shown in FIG. 4B, and similar concepts can be applied to MSB pages. At block 600, a counter "i" is initialized to zero, as is a collection r (e.g., array, vector, list, etc.). The r collection holds the value of k-multiple soft reads of the memory location (e.g., cell). In this case, the variable i is used in a loop 602 that increments k-times. For the case of the LSB soft-read example shown in FIG. 4B, k=3. If it is determined 604 that the voltage read is greater than $R_1$, then a zero is added 606 to the r collection, otherwise a one is added 608. The resulting value of r can be used to determine which p(s,r) value (e.g., one of the buckets seen in FIG. 4C) is incremented at block 506 in FIG. 5.

Figure 7:
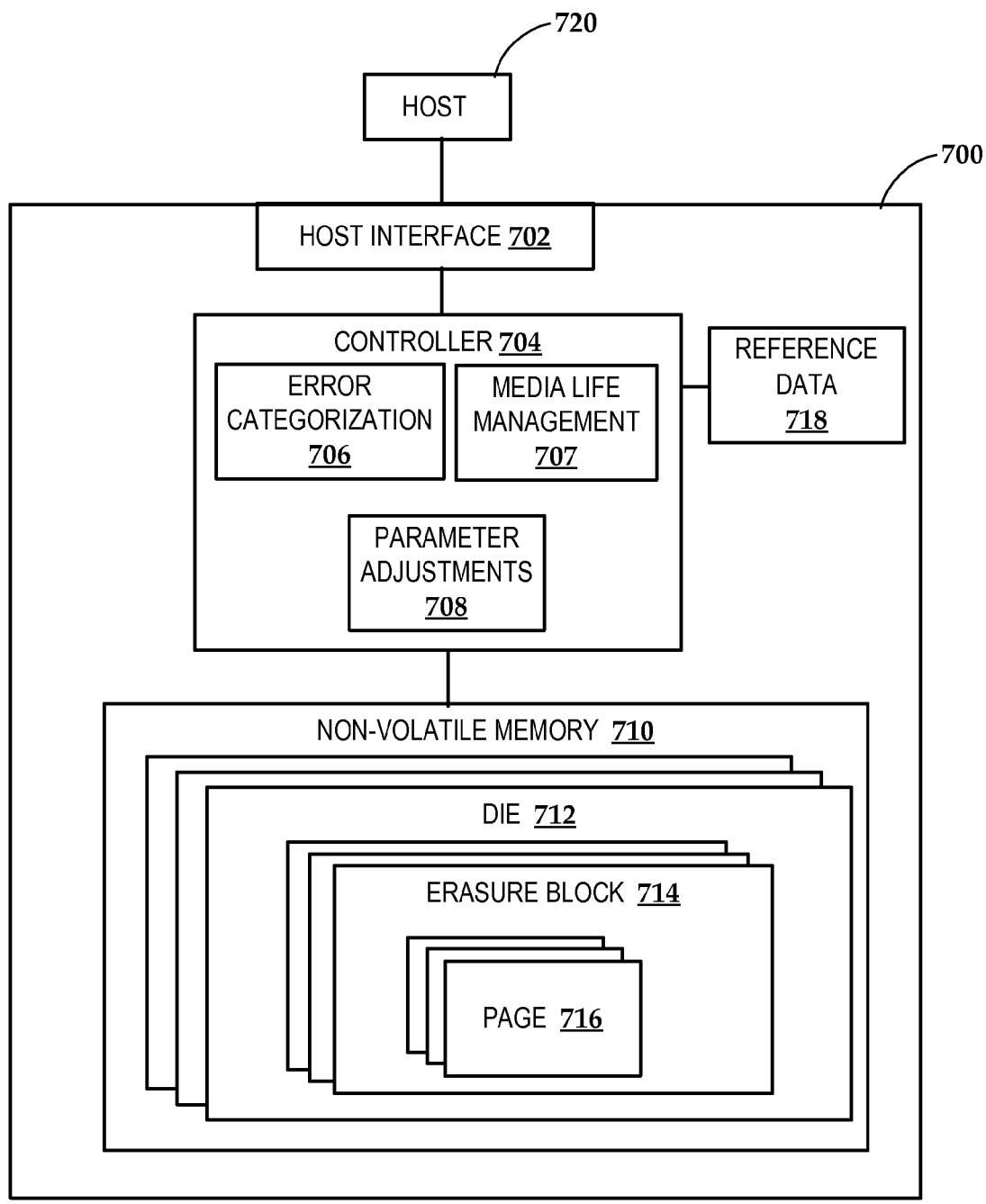
FIG. 7 is a block diagram of an apparatus according to an example embodiment.

In the embodiments described herein, read errors statistics can be gathered and categorized based on expected and individual values for each memory cell. In FIG. 7, a block diagram illustrates an apparatus 700 according to an example embodiment. The apparatus 700 may be any type of persistent solid-state storage device, including a solid-state drive (SSD), thumb drive, memory card, embedded device storage, etc. The apparatus 700 may include a host interface 702 that facilitates communications between the apparatus 700 and the host system 720, e.g., a computer. The apparatus 700 also includes media, here shown as solid-state, non-volatile memory 710. A host 720 can store data on the memory 710 and read data from the memory 710 via the host interface 702, which hides the operation of internal components of the apparatus 700 from the host 720.

The non-volatile memory 710 includes the circuitry and media used to persistently store both user data and other data managed internally by apparatus 700. The non-volatile memory 710 may include one or more flash dies 712, which individually contain a portion of the total storage capacity of the apparatus 700. The memory contained within individual dies 712 may be further partitioned into blocks, here annotated as erasure blocks/units 714. The erasure blocks 714 represent the smallest individually erasable portions of memory 710. The erasure blocks 714 in turn include a number of pages 716 that represent the smallest portion of data that can be individually programmed or read. In a NAND configuration, for example, the page sizes may range from 4 kilobytes (KB) to 8 KB, and the erasure block sizes may be on the order of one megabyte (MB). It will be appreciated that the present embodiments described herein are not limited to any particular size of the pages 716 and blocks 714, and may be equally applicable to smaller or larger data unit sizes.

The apparatus 700 includes one or more controllers 704, which may include general- or special-purpose processors that perform operations of the apparatus. The controller 704 may include any combination of microprocessors, digital signal processor (DSPs), application specific integrated circuits (ASICs), field programmable gate arrays (FPGAs), or other equivalent integrated or discrete logic circuitry suitable for performing the various functions described herein.

Functions that may be provided by the controller 704 include read/write operations, media life management, error categorization, and parameter adjustment, which are represented here respectively by functional modules 706-708. The modules 706-708 may be implemented using any combination of hardware, software, and firmware, and may cooperatively perform functions related to error analysis as described herein. Error categorization module 706 performs operations related to categorizing errors stored in the memory 710. These operations may include determining expected values of data stored in the memory 710, e.g., by looking at the stored data itself, or by use of reference data 718. The reference data 718 may be stored within or separate from the main memory 710, and may include duplicate data, additional ECC data, etc.

At some point in time, the error categorization module may make a comparison with data stored in memory 710 with reference data. This comparison may include, for example, a bitwise XOR that can be used to identify particular cells that exhibit errors, as well as physical characteristics of the error, e.g., magnitude and direction of floating gate voltage shifts that resulted in the error. This data may come from analog read/write channels, encoders, decoders that directly interact with the media 710. In some cases the underlying physical characteristics can be derived from digital results, e.g., based on hard decision values of the entire cell data as shown in FIG. 1A and/or soft decision values on MSB and/or LSB values as shown in FIGS. 4A and 4B.

The results obtained by the error characterization module 706 can be used by the media life management module 707 and by parameter adjustment module 708. The media life management module 707 monitors read/write operations and other factors related to wear and condition of the media 710. The module 707 may create and update statistics/metrics related to these operations, such as tracking program-erase cycles, time of operation, etc. The statistics may be updated based on patterns detected via the error characterization module 706. For example, metrics maintained by the media life management module 707 may be modified to increase apparent age of modules that exhibit certain classes of errors (e.g., complex errors as described above). This may result in the affected memory more likely to be refreshed, e.g., via garbage collection, use of increased ECC, and potential retirement of the cells from further use. These metrics may be applied at any level of granularity, e.g., page 716, block 714, die 712, etc.

The results obtained by the error characterization module 706 can be used by the parameter adjustment module 708 make minor changes to parameters used in memory access operations. This may include adjustment of reference voltages used in reading, writing, and/or erasing of particular pages 716, blocks 714 and/or dies 712. For example, if a subset of cells of a particular page exhibit a particular category of errors, the entire page may be adjusted as a whole if the resulting performance would lead to fewer future errors, e.g., as determined by BER.

Figure 8:
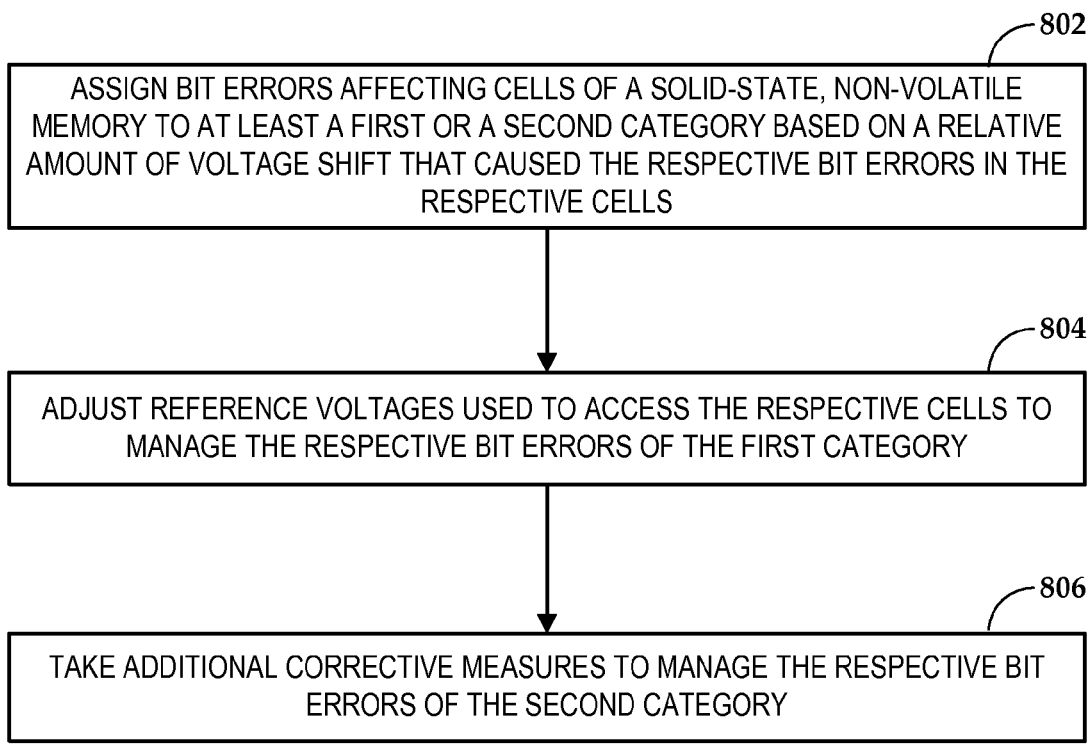
FIG. 8 is a flowchart of a procedure according to an example embodiment.

In reference now to FIG. 8, a flowchart illustrates a procedure according to an example embodiment. The procedure involves assigning 802 bit errors affecting cells of a solid-state, non-volatile memory to at least a first or a second category based on a relative amount of voltage shift that caused the respective bit errors in the respective cells. The relative amount of voltage shift may be determined based on soft data of the cells. The first and second categories may be based on conditional probabilities of actual values read from the cells in view of expected values of the cells. The cells may include multi-level cells, and in such a case, the first category may include errors caused by voltage shifts between two adjacent voltage levels, and the second category may include complex errors caused by voltage shifts between two non-adjacent voltage levels.

Reference voltages used to access the respective cells are adjusted 804 to manage the respective bit errors of the first category. Additional corrective measures are taken 806 to manage the respective bit errors of the second category. Taking the additional corrective measures may include retiring the respective cells associated with the second category of bit errors and/or adjusting an error correction code used in association with the respective cells. Adjusting of the reference voltages and/or the taking of the additional corrective measures may be performed on pages that include the respective cells.

The various embodiments described above may be implemented using circuitry and/or software modules that interact to provide particular results. One of skill in the computing arts can readily implement such described functionality, either at a modular level or as a whole, using knowledge generally known in the art. The structures and procedures shown above are only a representative example of embodiments that can be used to facilitate managing errors in flash memory as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method, comprising:
assigning bit errors affecting cells of a solid-state, non-volatile memory to at least a first or a second category based on a relative amount of voltage shift that caused the respective bit errors in the respective cells, wherein the first and second categories are based on conditional probabilities of actual values read from the cells in view of expected values of the cells;
adjusting a reference voltage used to access the respective cells to manage the respective bit errors of the first category; and
taking additional corrective measures to manage the respective bit errors of the second category.

2. The method of claim 1, wherein taking the additional corrective measures comprises retiring the respective cells associated with the second category of bit errors.

3. The method of claim 1, wherein taking the additional corrective measures comprises adjusting an error correction code used in association with the respective cells.

4. The method of claim 1, wherein the cells comprise multi-level cells, and wherein the first category comprises errors caused by voltage shifts between two adjacent voltage levels, and wherein the second category comprises complex errors caused by voltage shifts between two non-adjacent voltage levels.

5. The method of claim 1, wherein the adjusting of the reference voltage and the taking of the additional corrective measures are performed on pages that comprise the respective cells.

6. The method of claim 1, wherein the relative amount of voltage shift is determined based on soft data of the cells.

7. An apparatus, comprising:
a controller capable of being coupled to a solid-state, non-volatile memory, the controller configured to:
assign bit errors affecting cells of the solid-state, non-volatile memory to at least a first or a second category based on a relative amount of voltage shift that caused the respective bit errors in the respective cells, wherein the first and second categories are based on conditional probabilities of actual values read from the cells in view of expected values of the cells;
adjust a reference voltage used to access the respective cells to manage the respective bit errors of the first category; and
take additional corrective measures to manage the respective bit errors of the second category.

8. The apparatus of claim 7, wherein taking the additional corrective measures comprises retiring the respective cells associated with the second category of bit errors.

9. The apparatus of claim 7, wherein taking the additional corrective measures comprises adjusting an error correction code used in association with the respective cells.

10. The apparatus of claim 7, wherein the cells comprise multi-level cells, and wherein the first category comprises first errors caused by voltage shifts between two adjacent voltage levels, and wherein the second category comprises second errors caused by voltage shifts between two non-adjacent voltage levels.

11. The apparatus of claim 7, wherein the adjusting of the reference voltage and the taking of the additional corrective measures are performed on pages that comprise the respective cells.

12. The apparatus of claim 7, wherein the relative amount of voltage shift is determined based on soft data of the cells.

13. The apparatus of claim 7, wherein the relative amount of voltage shift determined for one of least significant bit or a most significant bit of the cell.

14. An apparatus comprising:
a controller capable of being coupled to a solid-state, non-volatile memory, the controller configured to:
determining a voltage difference between an expected voltage level and an actual voltage level associated with a bit error affecting at least one cell of the solid-state, non-volatile memory;
in response to the voltage difference satisfying a threshold based on conditional probabilities of actual values read from the cells in view of expected values of the cells, adjust a parameter used to access the cell based on the voltage difference; and
take additional corrective measures to manage the bit error in response to the voltage difference not satisfying the threshold.

15. The apparatus of claim 14, wherein adjusting the parameter used to access the cell comprises determining a magnitude and direction of the voltage difference, and adjusting at least one of a read threshold voltage and a programming threshold voltage associated with the cell.

16. The apparatus of claim 14, wherein taking the additional corrective measures comprises retiring a page associated with the cell.

17. The apparatus of claim 14, wherein taking the additional corrective measures comprises adjusting an error correction code used in association with cell.

18. The apparatus of claim 14, wherein the cell comprises a multi-level cell, and wherein the threshold comprises a voltage shift between two adjacent voltage levels or less.

19. The apparatus of claim 14, wherein the adjusting of the parameter and the taking of the additional corrective measures are performed on a page that comprises the cell.

* * * * *